United States Patent [19]
Fellows et al.

[11] Patent Number: 5,377,282
[45] Date of Patent: Dec. 27, 1994

[54] OPTICAL INSPECTION SYSTEM UTILIZING DYNAMIC ANALOG-TO-DIGITAL THRESHOLDING

[75] Inventors: Todd C. Fellows; Norman E. Rittenhouse, both of Endicott; Peter J. Yablonsky, Apalachin, all of N.Y.

[73] Assignee: International Business Machines Corporation, Armonk, N.Y.

[21] Appl. No.: 762,149

[22] Filed: Sep. 19, 1991

[51] Int. Cl.$^5$ .................. G06K 9/38; H03K 5/153; H03K 7/00

[52] U.S. Cl. ...................... 382/53; 327/72; 327/91

[58] Field of Search ............ 382/50, 53, 52, 8; 358/282, 280; H04N 1/40; 235/455; 307/351, 356, 358; 328/151, 164; 348/572, 573

[56] References Cited

U.S. PATENT DOCUMENTS

| | | | |
|---|---|---|---|
| 4,230,265 | 10/1980 | Casaly | 235/455 |
| 4,247,873 | 1/1981 | Decuyper | 358/282 |
| 4,251,837 | 2/1981 | Janeway, III | 358/280 |
| 4,442,544 | 4/1984 | Moreland et al. | 382/53 |
| 4,446,486 | 5/1984 | Itoh | 358/280 |
| 4,453,268 | 6/1984 | Britt | 382/50 |
| 4,468,704 | 8/1984 | Stoffel et al. | 358/282 |
| 4,539,600 | 9/1985 | Takahashi et al. | 358/282 |
| 4,566,125 | 1/1986 | Clunn | 382/48 |
| 4,593,325 | 6/1986 | Kannapell et al. | 358/282 |
| 4,626,922 | 12/1986 | Saitoh | 358/282 |
| 4,644,410 | 2/1987 | Schlichtig | 358/282 |
| 4,691,239 | 9/1987 | Nelson et al. | 358/282 |
| 4,731,862 | 3/1988 | Tsuda et al. | 382/50 |
| 4,766,332 | 8/1988 | Pelgrom et al. | 307/358 |
| 4,794,647 | 12/1988 | Forgues et al. | 382/8 |
| 4,856,075 | 8/1989 | Smith | 382/50 |
| 4,876,605 | 10/1989 | Ishikawa et al. | 358/400 |
| 4,908,875 | 3/1990 | Assael et al. | 382/52 |
| 4,998,122 | 3/1991 | Kanno et al. | 358/462 |

FOREIGN PATENT DOCUMENTS 0217607 9/1986 European Pat. Off.

OTHER PUBLICATIONS

Klepp, "Dynamic Video Thresholding", IBM Tech Discl., vol. 22, No. 3 pp. 1031-1033, (Aug. 1979).

Wilson, "Thresholding of Video Signals" IBM Tech. Discl., vol. 16, No. 12, pp. 4021-4022 (May 1974).

Penny, "Dynamic Threshold Setting Circuit", IBM Tech Discl. Bull. vol. 18, No. 6 pp. 1962-1965 (Nov. 1975).

IBM Technical Disclosure Bulletin, vol. 24, No. 1B, pp. 847-848 Jun. 1981.

IBM Technical Disclosure Bulletin, vol. 24, No. 2, pp. 1209-1211 Jul. 1981.

*Primary Examiner*—David K. Moore
*Assistant Examiner*—Michael R. Cammarata
*Attorney, Agent, or Firm*—Calfee Halter & Griswold

[57] ABSTRACT

An optical imaging surface inspection system and method are provided. The system comprises an illumination source for illuminating an image pattern on a surface to be inspected, a video camera for detecting a portion of the light reflected from the surface and outputting an analog video signal, a dynamic thresholding circuit for converting the analog video signal into a digital representation of the image pattern, and means to compare a known accurate digital representation of the image pattern to the digital representation provided by the dynamic thresholding circuit. The method includes the steps of illuminating the surface, scanning the surface with the video camera, separating the video signal into a black level signal component and a white level signal component, detecting successive peak levels in the white level signal component and outputting a corresponding variable peak voltage. A variable threshold voltage is determined by selecting a percentage of the variable peak voltage. This variable threshold voltage is then compared with a delayed portion of the analog video signal to provide the digital representation of an image pattern on the surface being inspected.

30 Claims, 7 Drawing Sheets

OPTICAL INSPECTION SYSTEM UTILIZING DYNAMIC ANALOG-TO-DIGITAL THRESHOLDING

TECHNICAL FIELD

The present invention relates generally to optical imaging surface inspection systems, and more specifically to an optical surface inspection system utilizing dynamic analog-to-digital thresholding means to digitize an analog signal related to light reflected by an image pattern at the surface to produce a digitized signal which accurately represents the image pattern.

BACKGROUND OF THE INVENTION

Optical imaging systems have many practical applications, including the inspection of material surfaces for defects or specific contours. These particular types of optical imaging systems typically include a source of illumination which can be reflected off the surface being inspected, an imaging lens for focusing the reflected illumination, and an optical detector for sensing this focused pattern of reflected illumination and outputting an analog signal corresponding thereto. The analog signal may then be digitized for further processing and analysis.

The source of illumination is typically a device emitting white light which is applied to the surface being inspected at a fixed angle. The optical detector is positioned relative to the surface at the same relative light receiving angle, and the surface is moved relative to these fixed positions of the illumination source and the optical detector. The light reflected from the portion of the surface upon which light is shined is focused by the imaging lens onto sensing elements in the optical detector.

The optical detector has as its primary function the detection of optical radiation. Detection, in general terms, is the measurement of optical radiation. More specifically, it is the conversion of optical energy to a measurable parameter. Typically this parameter is an electrical quantity such as a voltage or current, represented by an analog signal outputted by the detector. Ideally, detectors exhibit a linear transfer characteristic over a wide dynamic range. In practice, however, the lower end of the useful dynamic range is often limited by noise and the upper end is limited by saturation.

Typically, video cameras are used as the optical detectors in optical imaging surface inspection systems. Sensing elements in the camera detect light reflected from the surface being inspected and output an analog video signal related to the amount of light detected. The signal comprises a series of pulses, each of which represents a portion of sensed reflected light. The white and black levels of this signal correspond to the portions of the signal representative of the reflective and nonreflective areas of the surface, respectively.

Theoretically, the video camera would respond instantaneously to abrupt changes in surface reflected illumination and output a video signal representing a step function. In practice, however, the analog signal generated by the camera representing the surface reflected illumination is sloped due to the response time of amplifiers in the camera, the finite resolution of the sensing elements in the camera, and the grey scale effect of illumination reflected off the surface. Thus in order to produce a signal which accurately represents the particular pattern on the surface being inspected, a threshold level must be selected at which level the analog video signal can be digitized. Typically, a threshold level is selected to obtain the most accurate digital representation of the physical characteristics of the surface. This threshold level is then applied to the entire line of pulses which make up the analog video signal.

The application of a constant threshold level to digitize all the pulses in an analog video signal, however, has several drawbacks. First, the amplitude of each of the pulses in the analog video signal, is increased by background reflected light near the particular portion of the surface at which the primary reflected light is sensed. Thus, the analog signal is positively offset by this background reflected light, the amount of offset referred to as the black level. This background reflected light or black level may be removed from the digitized video signal by offsetting the threshold level by the amount of background reflected light. The black level, however, varies across the surface being inspected and may, in fact, vary for each individual pulse in the analog video signal, resulting in pulses which do not accurately represent the light reflected by the image pattern on the surface being inspected. Applying a constant threshold level to a series of these pulses in the analog video signal, then, will not compensate for a black level which varies over real time.

Second, the level of white light reflected by similarly contoured portions of the surface being inspected may not be the same. This varied degree of reflectance may by caused by variances in the output of the illumination source or by variances in the reflectivity of similarly contoured portions of the pattern. Weak video signal pulses having amplitudes which fall below the selected threshold level may not be recognized or subsequently digitized. Application of a constant threshold level to the video pulse train will thereby result in an inaccurate digital representation of the surface being inspected.

Third, the video camera may not output the same analog signal for a given level of illumination. A low video signal level may result from low sensitivity of the video camera sensing elements or low output from the video camera charge amplifiers. Thus, this nonuniformity of the video camera components may result in pulses in the analog signal having varied peak amplitudes for similar portions of the surface being inspected. A constant threshold level applied to a series of these pulses will not compensate for this peak amplitude variance.

Nonuniform digital imaging may result from any one of the above problems, and a cumulative adverse effect on the digital image may result if more than one of these problems is present. If the adverse effect caused by each of these problems could be adequately characterized, a programmed, variable threshold could be applied to the series of pulses in the analog video signal. However, because the characterized effects are likely to change over time, the programmed threshold may not provide the appropriate correction factor, and may in fact further distort the resultant digital image.

Thus, there is a need for an optical imaging surface inspection system which can produce an accurate representation of the image on the surface by utilizing a dynamic thresholding technique which compensates for real time variances in background reflected illumination, reflectance across the surface, and video camera functional capabilities. The present invention addresses this need.

SUMMARY OF THE INVENTION

The present invention provides a system and method for inspecting an image pattern on a surface in order to detect defects in the image pattern. A portion of the surface being inspected is illuminated by a source of illumination and scanned by a video camera. The video camera senses the portion of the light reflected by the surface and outputs a corresponding analog video signal. The video signal is digitized using a threshold level which is varied for each pulse in the signal which represents light reflected by the image pattern. The resulting digitized signal is then post-processed to determine defects in the pattern being inspected. Although the present invention may be used to inspect any surface having an image pattern that will reflect light, it is particularly useful for inspecting printed circuit boards having a reflective pattern of conductive printed circuit lines etched therein.

The system includes a source of illumination, a video camera, a dynamic thresholding circuit and means to compare the output of the dynamic thresholding circuit with the digital representation of the image pattern store, in reference memory. The source of illumination is used to shine white light upon the surface to be inspected. The video camera scans the surface and senses the portion of the light reflected by the surface as the position of the surface changes relative to the source of illumination and the video camera. An analog signal representing the amount of light reflected by the image pattern and a background surface area surrounding the image pattern is outputted by the video camera as it scans the surface, and sent to the dynamic thresholding circuit.

The dynamic thresholding circuit converts the analog video signal into a digital representation of the image pattern being inspected. The analog video signal is first separated into a black level signal component representing light reflected by the background surface and a white level signal component representing light reflected by the image pattern. The white level signal component is then fed into a video amplifier circuit which amplifies the signal if it falls below a predetermined selectable value. The output of the video amplifier is sent to a peak detector circuit which detects the peak voltage of each successive pulse in the white level signal pulse train, and outputs a variable peak voltage having an amplitude corresponding to the highest voltage detected for each pulse.

The variable peak voltage drives a digital-to-analog multiplier in the dynamic thresholding circuit. An external digital input to the digital-to-analog multiplier provides means to select as a variable threshold voltage a fixed percentage of the variable peak voltage. This input also sets the threshold voltage to a minimum should a peak not be detected. The digital-to-analog multiplier outputs a variable threshold voltage which is either this minimum voltage or a fixed percentage of a peak voltage detected.

An analog-to-digital comparator compares the variable threshold voltage outputted by the digital-to-analog multiplier with corresponding segments of the white level signal component which have been delayed. The comparison yields a digital representation of the image pattern being scanned. The output of the comparator is then post-processed to identify defects in the pattern being scanned.

DETAILED DESCRIPTION OF THE PREFERRED EMBODIMENT

According to the present invention, an optical imaging inspection system and method are provided wherein an analog video signal representing an image on a surface is digitized using a dynamic analog-to-digital thresholding technique. The threshold applied to the analog video signal during the digitization process is varied for each pulse in the signal representing a feature of the image being inspected.

Figure 1:
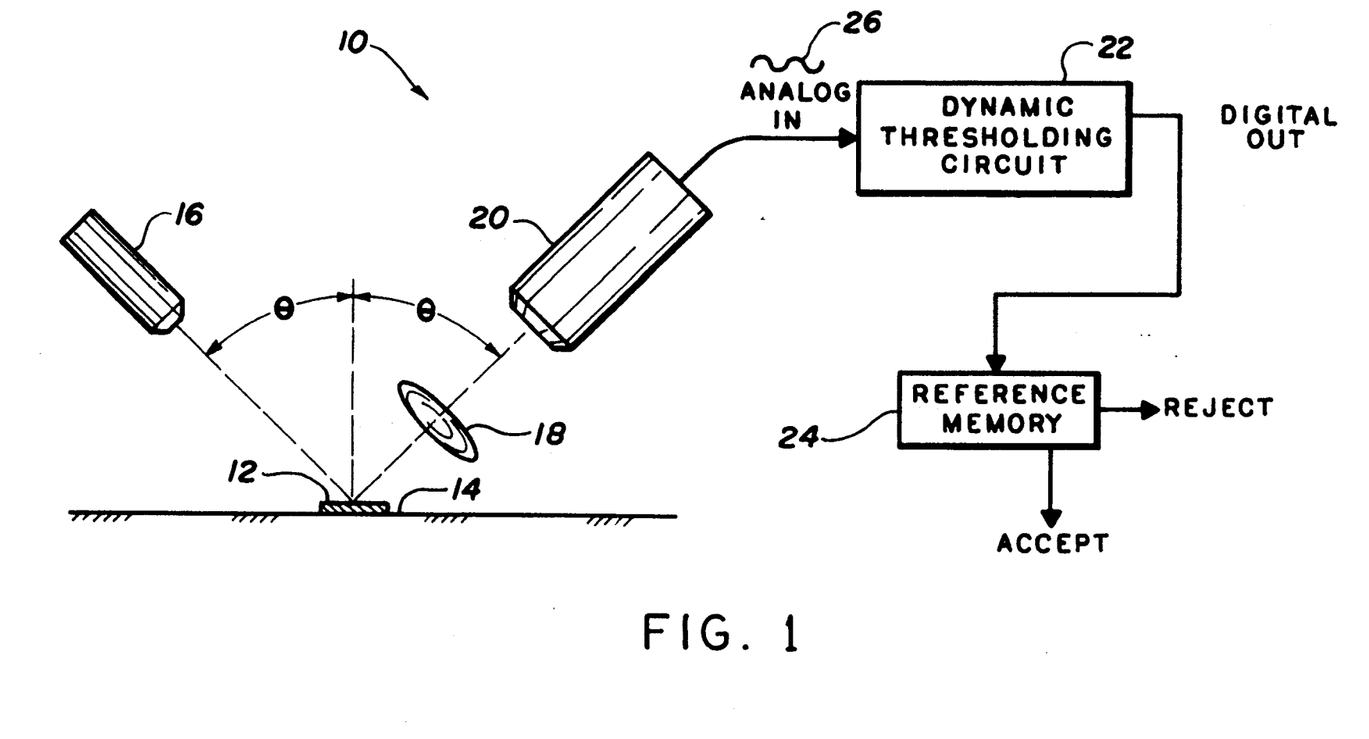
FIG. 1 is a block diagram of the optical inspection system constructed according to the principles of the present invention.

A block diagram of an inspection system constructed according to the present invention is shown generally at 10 in FIG. 1. The system 10 is used to inspect an image pattern 12 on a surface 14. Although the system is particularly useful for inspecting printed circuit lines etched into a circuit card for defects (e.g., open or short circuits, or weakened printed circuit lines), the system is broadly applicable to inspect any generally reflective pattern on a generally nonreflective surface. The system comprises an illumination source 16, an optical focusing lens 18, a video camera 20, a dynamic analog-to-digital thresholding circuit 22 and a reference memory 24.

The illumination source 16 may be any commercially available source of white light. The illumination source provides a beam of white light to the surface being inspected and is positioned at a fixed angle over the surface. The video camera 20 is also a commercially available unit such as Model No. CAM 1500 manufactured by Fairchild Weston, Inc. of Milpitas, Calif. The video camera 20 is similarly positioned at the same fixed angle over the surface 14 so that light emitted by the illumination source 16 and reflected by the image pattern 12 on the surface is directed toward a lens in the video camera. The optical focusing lens 18 may be positioned intermediate the surface 14 and the video camera 20 to aid in focusing the reflected light onto the camera lens.

The position of the illumination source 16, the optical focusing lens 18 and the video camera 20 are fixed with respect to each other and movable with respect to surface 14. Such an arrangement permits continuous scanning of the illuminated portion of the surface so that the analog video signal representing the image pattern 12 can be continuously processed and digitized. Either the surface 14 may be moved under the illumination source 16, the focusing lens 18 and the video camera 20, or these three elements may be moved as a unit over the surface. In the alternative, both (i) the surface and (ii) the camera, lens and illumination source as a unit may move with respect to each other so that the entire surface may be scanned. In any of these arrangements, the video camera outputs a continuous analog video signal 26 representing the image pattern 12 being scanned. The amplitude of the video signal 26 varies as the image pattern is scanned, and represents at any given time the amount of light reflected by the image pattern and a background surface area surrounding the image pattern. The analog video signal 26 comprises a series of pulses, each of which constitutes a white level signal component representing light reflected by the image pattern and a black level signal component representing light reflected by the background surface area.

The analog video signal 26 output by the video camera 20 is fed into the dynamic thresholding circuit 22 for further processing. The dynamic thresholding circuit processes the analog signal and outputs a digital representation of the image pattern 12. This digital representation is post-processed to identify defects in the image pattern being scanned.

Figure 2:
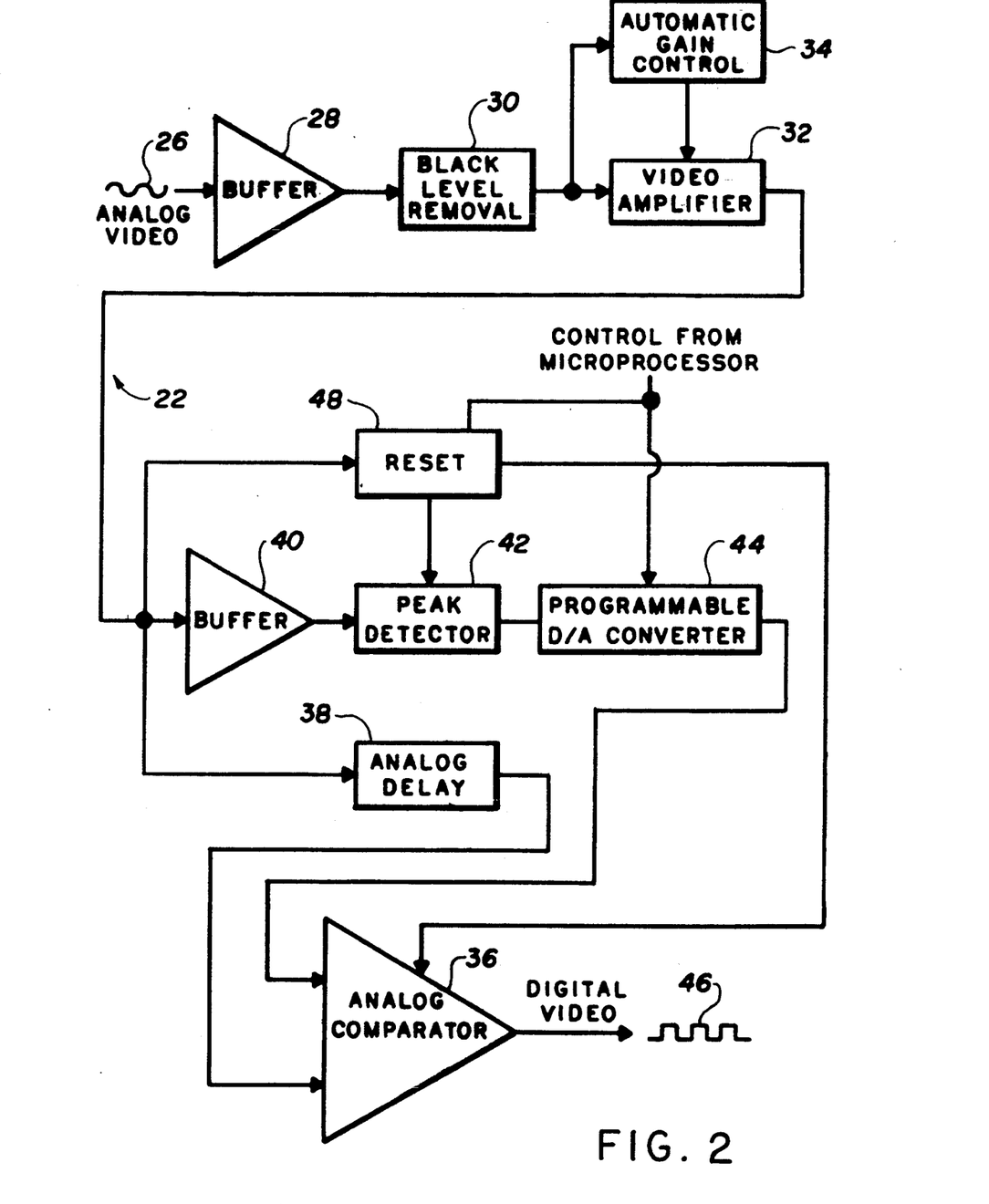
FIG. 2 is a block diagram of the dynamic thresholding circuit of the optical inspection system of FIG. 1.
Figure 3A:
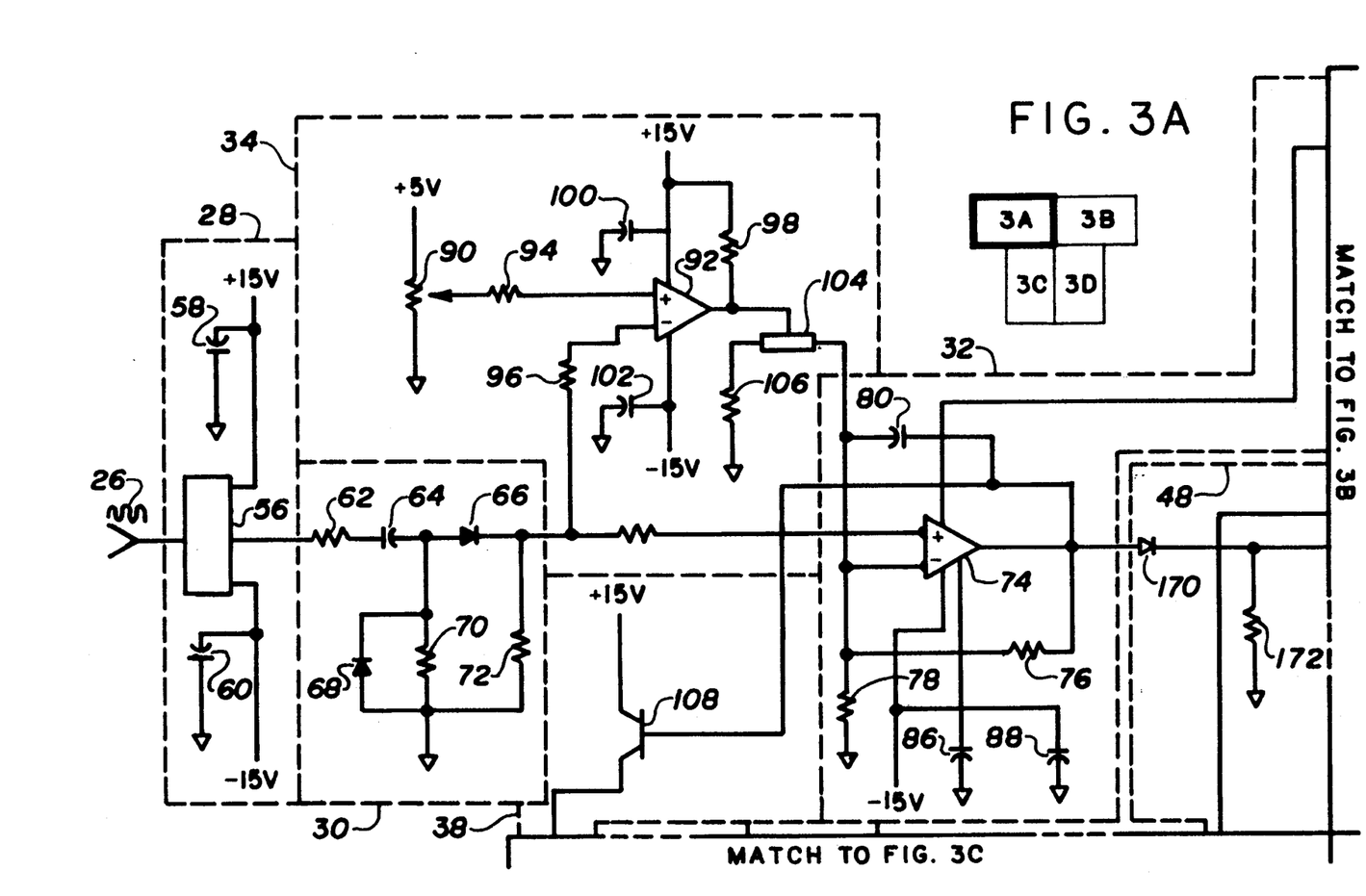
FIGS. 3A–3D, taken together, are a schematic diagram of the dynamic thresholding circuit of FIG. 2.
Figure 3B:
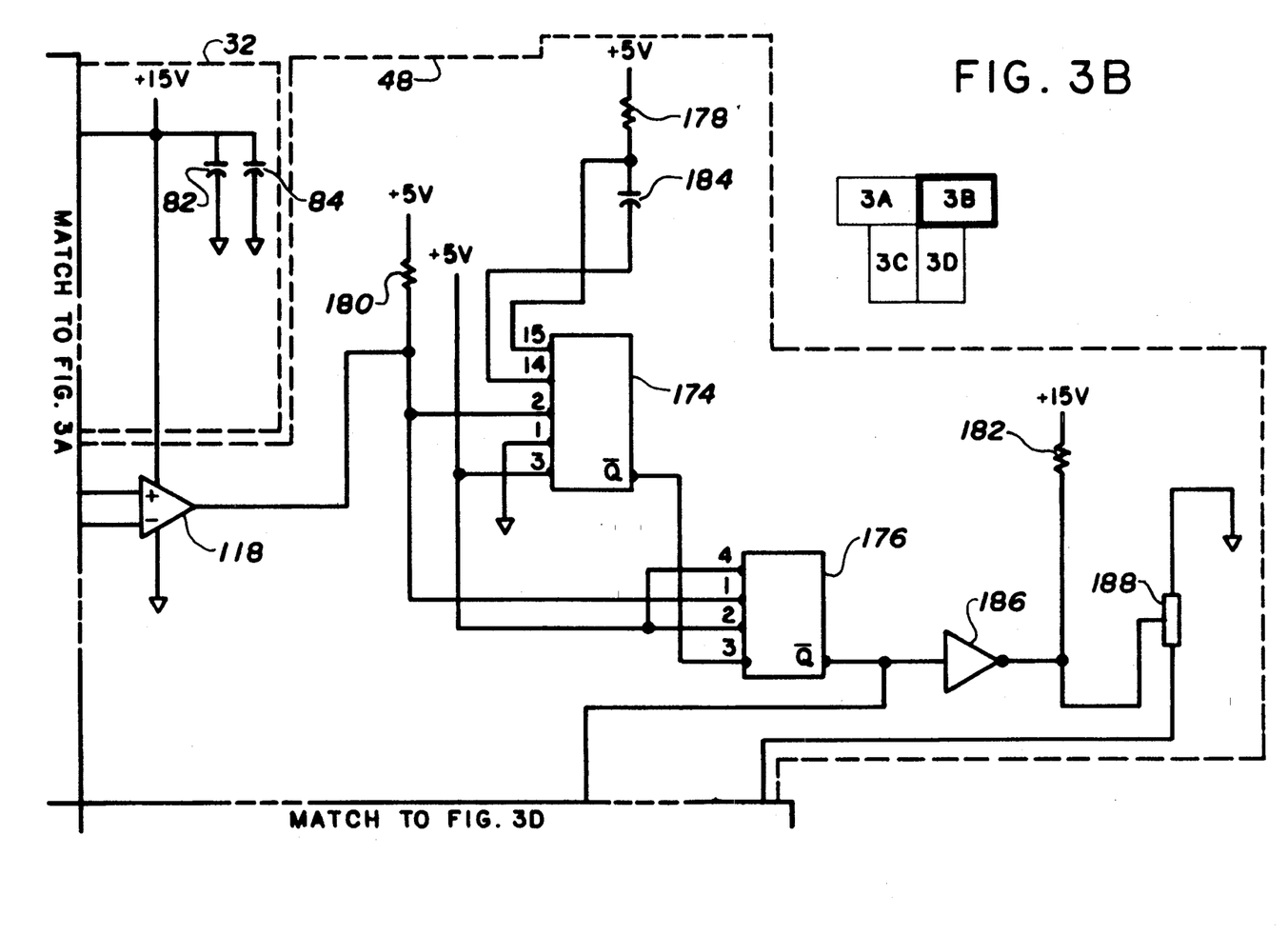
Figure 3C:
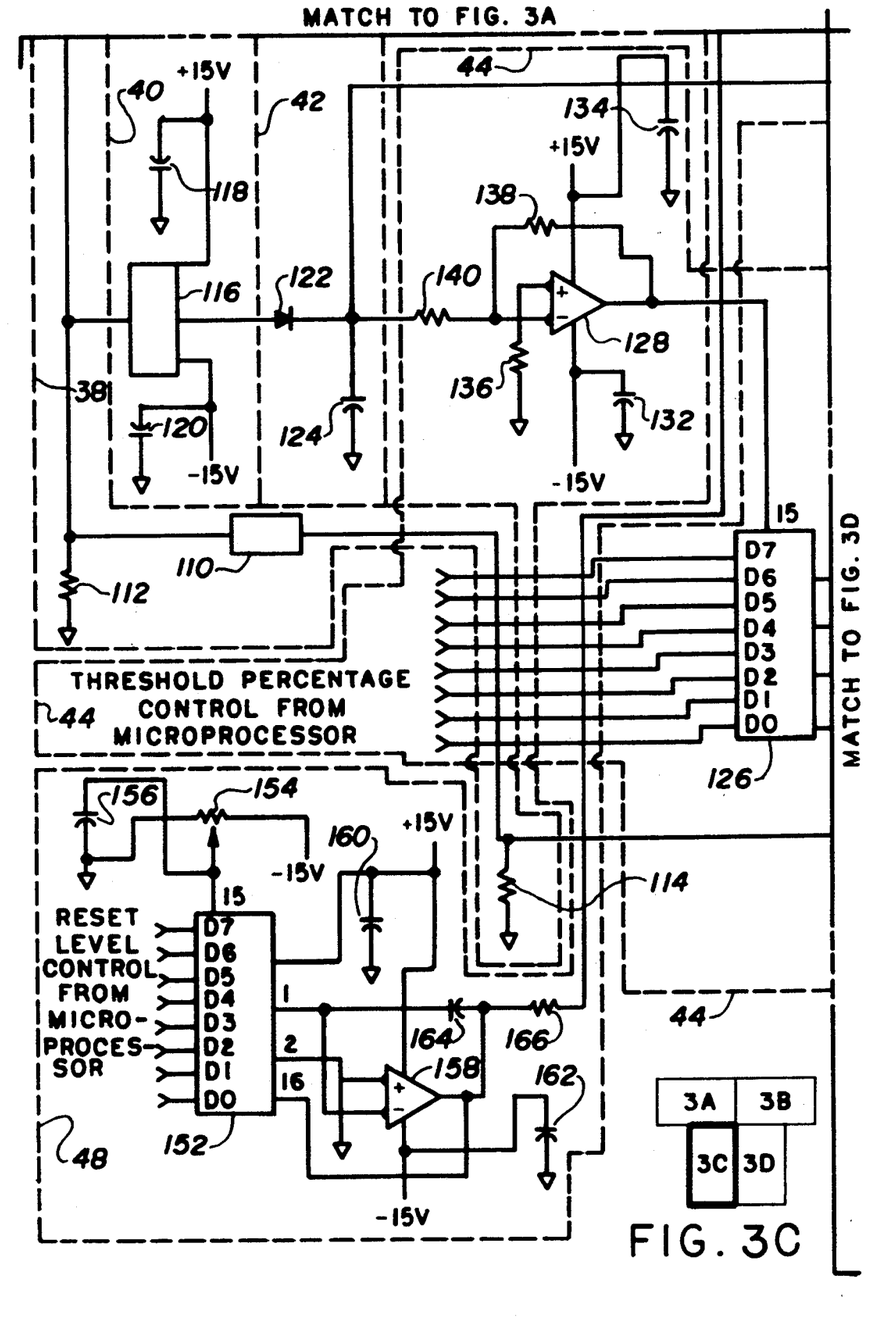
Figure 3D:
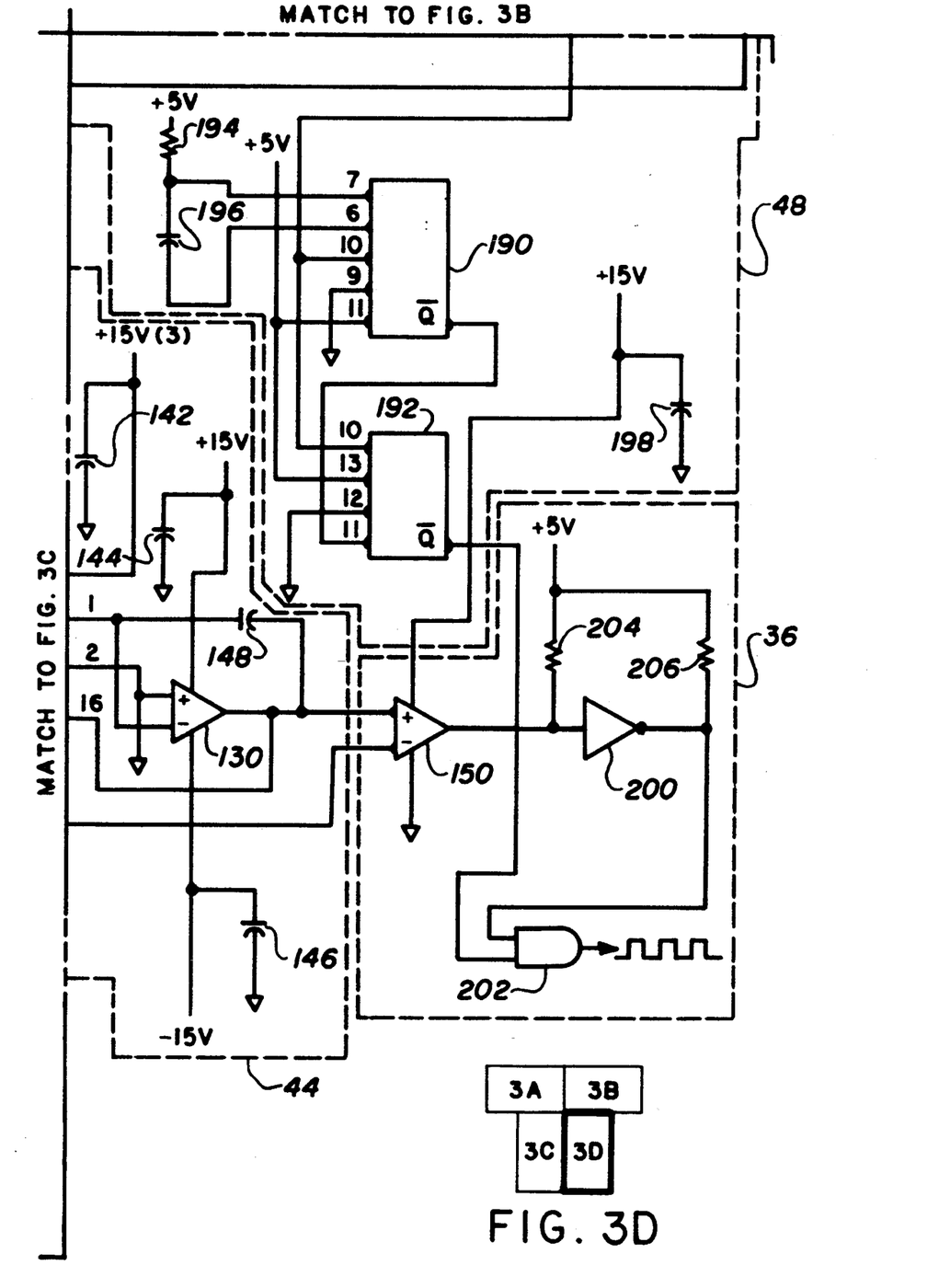
Figure 4A:
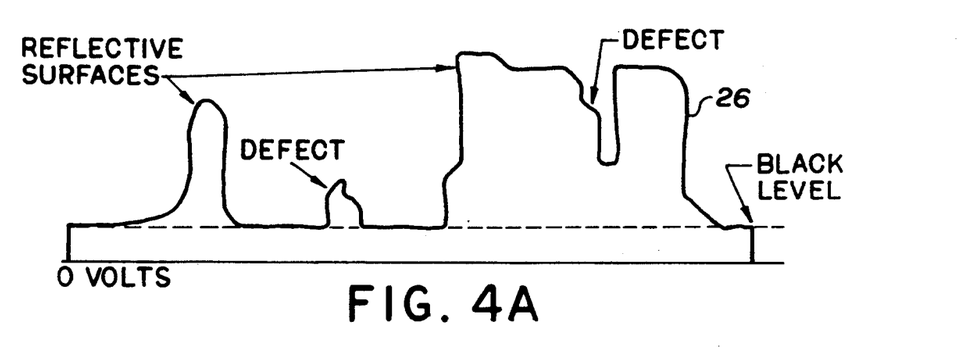
FIG. 4A is a signal waveform of the analog video signal shown in FIG. 1.
Figure 4B:
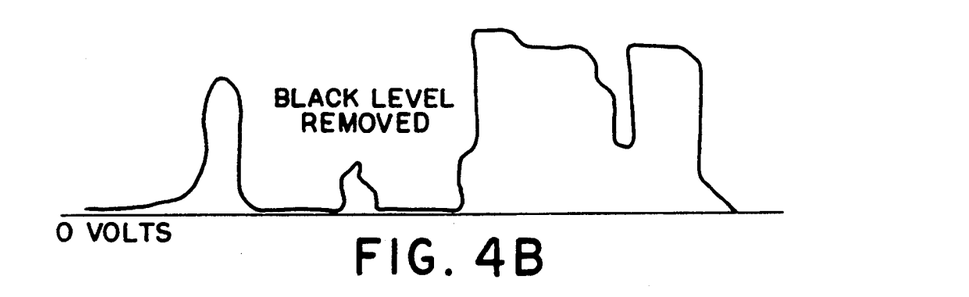
FIG. 4B is a signal waveform of the output of the black level removal circuit of the system of FIG. 1.
Figure 4C:
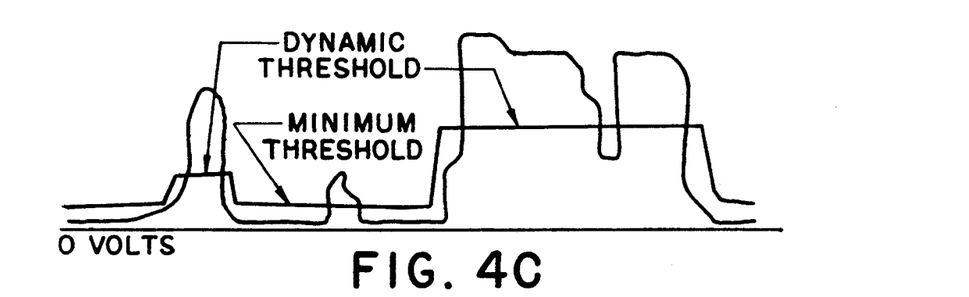
FIG. 4C is a signal waveform of the output of the D/A converter of the system of FIG. 1.
Figure 4D:
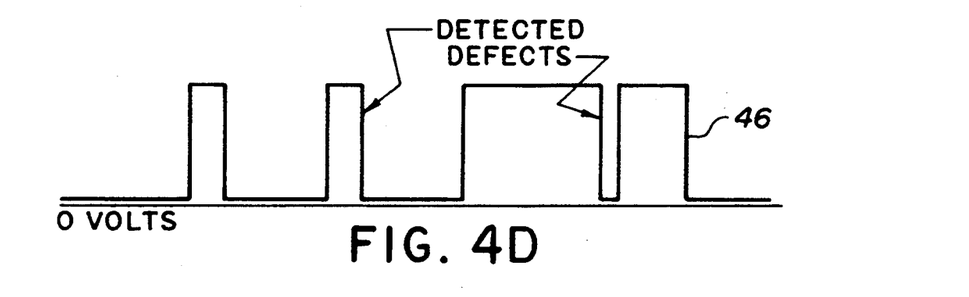
FIG. 4D is a signal waveform of the digital video signal shown in FIG. 1.

FIG. 2 shows a block diagram of the individual circuits which make up the dynamic thresholding circuit 22. As shown in FIG. 2, the analog video signal 26 is first fed into a high speed video buffer circuit 28 which isolates the dynamic thresholding circuit from the electronics in the video camera 20. The buffered analog video signal is then stripped of its black level signal component by a black level removal circuit 30 and amplified by a video amplifier circuit 32. An automatic gain control circuit 34 is selectively activated to amplify the analog video signal stripped of its black level signal component should its amplitude fall below a predetermined levels. As will be explained later, this predetermined level is manually selectable.

The amplified analog video signal takes three separate paths after leaving the video amplifier circuit 32, each of which converges at an analog comparator circuit 36 which converts the analog video signal into a digital video signal. First, the analog signal is fed into an analog delay circuit 38 which delays the signal by a few pixels or nanoseconds. This delay is necessary in order to permit a simultaneous comparison at the comparator circuit 36 of the analog video signal pulses and a variable threshold level which is determined by the amplitude of the analog video signal pulses. Secondly, the amplified video signal is fed through a second buffer circuit 40 to a peak detector circuit 42 which determines the individual peaks of the amplified video signal pulses. A percentage of the individual peak levels is then selected by a programmable digital-to-analog converter circuit 44. The output of the converter circuit 44 is the variable threshold level which is compared to the delayed analog video signal at comparator circuit 36. The comparator circuit outputs a digital video signal 46 resulting from this comparison. Lastly, the amplified analog video signal is fed into a reset circuit 48 which resets the peak detector circuit 42 and disables the comparator circuit 36 intermediate successive pulses in the analog video signal, for reasons which will be explained later.

FIG. 3 is a schematic diagram of the dynamic analog-to-digital thresholding circuit of FIG. 2. Power to all of the components shown in FIG. 3 is provided by an external power supply providing constant DC supply levels of +5 VDC, +15 VDC and −15 VDC. These voltage levels are applied to the circuit components as shown.

As illustrated in FIG. 3, the analog video signal 26, comprising a black level signal component and a white level signal component, is fed into the high speed video buffer circuit 28 which comprises a high speed video cable driver 56 and bypass capacitors 58 and 60. The cable driver 56 in the preferred embodiment is a model HA 5002 manufactured by Harris which is capable of handling 400 milliamps of output current. The cable driver 56 provides means to buffer or isolate the remaining components of the thresholding circuit of FIG. 3 from the electronic circuitry in the video camera 20. The bypass capacitors 58 and 60 are valued at 0.1 $\mu$F. Unless otherwise noted, all bypass capacitors referred to in FIG. 3 are valued at 0.1 $\mu$F.

The buffered analog video signal then passes through the black level removal circuit 30 where the black level signal component is stripped from the analog video signal, leaving only the white level signal component. The white level signal component is represented by a series of fast spikes or pulses, generally from 100 nanoseconds to 100 microseconds in width, and the black level is represented by a positive DC offset. The black level removal circuit, a differential circuit comprising a 10$\Omega$ input resistor 62, a bypass capacitor 64, a pair of diodes 66 and 68, and a pair of resistors 70 and 72. The diodes are both Schottky-type diodes such as model No. 1N5817. Diode 68 is reverse-biased and is paralleled across resistor 70 which is valued at 8.2K $\Omega$. Diode 68 builds up a charge across resistor 70 as the buffered analog video signal passes through circuit 30 effectively removing the black level signal component therefrom. Diode 66 is forward biased and clamps the white level signal component to ground through resistor 72, which has a resistance value of 220$\Omega$.

The remaining white level signal component of the analog video signal is fed into the video amplifier circuit 32 which is in part controlled by the automatic gain control circuit 34. These two circuit work together to amplify weak video pulses in the analog signal so that further processing can take place. The video amplifier circuit comprises an operational amplifier 74, resistors 76 and 78, and capacitors 80, 82, 84, 86 and 88. The operational amplifier 74 is a high speed amplifier such as a model LM6364. Resistors 76 and 78 are valued at 1K $\Omega$ and 100K $\Omega$, respectively. The gain of operational amplifier 74 is thus 1+1/100 or 1.01. Capacitor 80 is valued at 200 pF and capacitor 86 is valued at 470 pF. Capacitors 82, 84 and 88 are all 0.1 $\mu$F bypass capacitors.

The automatic gain control circuit 34 is designed to boost the amplitude of the white level signal component of the analog video signal should it drop below a predetermined voltage level. The predetermined voltage level is set by variable resistor 90, the resistance of which can be varied up to 10K $\Omega$. A high speed comparator 92 such as an LM319 has connected to its non-inverting input, through resistor 94, the output of variable resistor 90. The inverting input of comparator 92 is connected to the output of the black level removal circuit 30 through resistor 96. Both resistor 94 and resistor 96 are 4.7K $\Omega$ resistors. A 1K $\Omega$ resistor 98 is connected between the +15 VDC power supply for the comparator 92 and the output of the comparator. Capacitors 100 and 102 are bypass capacitors for the automatic gain control circuit.

The output of comparator 92 goes HIGH when the output of the black level removal circuit drops below the voltage level set by variable resistor 90. Typically, this level is set at around two volts. When the comparator output goes HIGH, an analog switch 104 (such as a model SD5001) is activated. Activating switch 104 effectively parallels a 500Ω resistor 106 across resistor 78 in the video amplifier circuit 32. The gain of operational amplifier 74 in the video amplifier circuit is thereby changed from around 1 to around 3. Thus, whenever the amplitude of the white level signal component of the analog video signal falls below the predetermined level, the automatic gain control circuit 34 amplifies the signal on the order of three times so that further processing can take place.

The output of the video amplifier circuit 32 is the output of operational amplifier 74. This output signal represents the amplified (or non-amplified if the automatic gain control circuit is inactive) analog video signal stripped of its black level component. This signal simultaneously fed into (i) the analog delay circuit (ii) the buffer circuit 40 and on to the peak detector circuit 42 and (iii) the reset circuit 48.

Regarding the first path described above, the output of the video amplifier circuit 32 is fed through a driver transistor 108, such as 2N2222 transistor, and into a delay device 110. The delay device in the preferred embodiment is a model 50700 tappable programmable delay line. The input and output of the delay device 110 are tied to ground through 500Ω resistors 112 and 114, respectively, in order to match the input and output impedance of the delay device. The output of the delay device 100 corresponds to the output of the analog delay circuit 38, and is one of the inputs to the analog comparator circuit 36.

Regarding the second path described above, the output of the video amplifier circuit 32 is fed into the high speed video buffer circuit 40. The buffer circuit 40, identical to the buffer circuit 28, comprises a high speed video cable driver 116 and bypass capacitor 118 and 120. The output of the buffer circuit 40 is then fed into the peak detector circuit 42. The peak detector circuit comprises a diode 122 and a capacitor 124. The diode 122, such as a model 1N5811, permits the output of the buffer circuit 40 to charge the capacitor, which in the preferred embodiment has a value of 100 pF. The capacitor 124 is thereby charged to the value of the peak amplitude of the analog video signal pulse passing through the buffer circuit 40.

As explained above, a percentage of the peak voltage level for each pulse in the analog video signal is used as a threshold level. This threshold level is compared to the delayed analog video signal from delay circuit 38 at the analog comparator circuit 36. The output of the peak detector circuit 42 is used to drive a multiplying programmable digital-to-analog converter (DAC) 126 which outputs the threshold level for a given pulse as a percentage of the peak detector output. The percentage is chosen using an 8-bit control signal from a microprocessor which determines the percentage of the DAC input that is output as a threshold level.

The DAC 126 used in the preferred embodiment is a 7523 DAC which requires inverted input signals. Thus, inverting amplifiers 128 and 130, both LM6364 amplifiers, are placed in the signal path (i) between the output of the peak detector circuit 42 and the DAC 126 and (ii) between the DAC 126 and the analog comparator circuit 36. Thus, the polarity of the analog signal compared in the comparator circuit 36 is the same as that detected in the peak detector circuit 42, having been inverted by amplifier 128 and re-inverted by amplifier 130.

The circuitry surrounding each of the inverting amplifiers 128 and 130 is known in the art, designed to power and stabilize the amplifier. Regarding the circuitry surrounding amplifier 128, capacitor 132 and 134 are bypass capacitors, and resistors 136, 138 and 140 are valued at 100K Ω, 200K Ω, and 200K Ω respectively. Regarding the circuitry surrounding amplifier 130, capacitors 142, 144 and 146 are bypass capacitors and capacitor 148 is valued at 12 pF.

The delayed analog video signal output by the analog delay circuit 38 is compared to the selected percentage of peak amplitude, or selectable threshold, output by the programmable DAC circuit 44 at comparator 150 in the analog comparator circuit 36. Comparator 150 is preferably a model LM 311 op amp comparator which outputs a digital representation of the video signal based upon this comparison.

In order for the comparator 150 to be able to compare the delayed analog video signal with a specific threshold for each successive pulse in the analog waveform, the peak detection circuit 42 must be reset intermediate successive pulses. This reset feature of the invention is accomplished by the reset circuit 48. The output of the reset circuit 48 is also used to disable the analog comparator circuit 36 intermediate these successive pulses to prevent electrical noise from affecting the digital output of the analog comparator circuit 36.

The level at which the peak detection circuit will be reset is determined by another programmable digital-to-analog converter 152, also a 7573 DAC. The input to DAC 152 is set at around −5 VDC using a 10K Ω variable resistor 154 connected to the −15 VDC supply and bypass capacitor 156. A percentage of this −5 volt input is selected to be output by the DAC 152 by an external 8-bit command from the microprocessor. Again, as with the DAC 126, DAC 152 requires an inverting amplifier 158 (also an LM 6364) to invert the negative output of the DAC 152 to a positive voltage. Bypass capacitors 160 and 162 and a 12 pF capacitor 164 are electrically connected to the inverting amplifier 158.

The positive output of inverting amplifier 158 represents the voltage level at which the peak detection circuit 42 will be reset intermediate successive pulses in the analog video waveform. This output is fed through a 4.7K Ω resistor 166 to the non-inverting input of an LM 311 comparator 168. The inverting input of comparator 168 accepts the output of the video amplifier circuit 32 through a 1N5811 Schottky-barrier diode 170. A 1K Ω resistor 172 connects the inverting input of comparator 168 to ground.

The output of the comparator 168 goes HIGH when the amplitude of the analog video signal through the diode 170 falls below the programmed reset level input to the comparator. This HIGH output drives a flip-flop circuit, which is also part of the reset circuit 48, to reset the peak detector circuit 42 and temporarily disable the analog comparator circuit 36. Cascaded flip-flops 174 (model 74221) and 176 (model 74LS74) provide a slight delay for the positive edge of the reset signal so that the peak detection circuit 42 is not reset before the entire pulse of video passes through the DAC 126. Regarding the various circuit elements surrounding flip-flops 174 and 176, resistor 178 is valued at 4.7K Ω, resistors 180 and 182 at both 1K Ω resistors, and capacitor 184 is valued at 220 pF.

The output of flip-flop 176 is (i) fed through an open collector transistor 186 (type 74LS06) to drive an analog SD5001 switch 188 which resets the peak detector circuit 38 by shortening capacitor 124 to ground and (ii) fed to a second flip-flop pair which temporarily disables the comparator circuit 36. The second flip-flop pair comprises flip-flop 190 (model 74221) and flip-flop 192 (model 74LS74) cascaded together to disable the comparator circuit 36 when the peak detector circuit 42 is being reset. Disabling the comparator circuit at this time is necessary due to slight oscillations introduced into the circuit by the reset signal. Completing the reset circuit 48 are circuit elements including a 1.4K Ω resistor 194, a 470 pF capacitor 196 and a bypass capacitor 198.

The analog comparator circuit 36 is where each pulse in the delayed analog video signal is compared to the selected percentage of the peak level detected for that same pulse (i.e., the variable threshold level). The output of comparator 150 of circuit 36 is thus a digital signal representing the portions of the analog video signal which exceed this variable threshold level.

As explained above, resetting the peak detector circuit causes oscillations in the circuitry which can effect the digital output of comparator 150. Thus, the output of comparator 150 is fed through a 74LS06 transistor 200 to one input of a TTL NAND gate 202. 1K Ω resistors 204 and 206 connect +5 VDC to the input and output of transistor 200. The other input of the NAND gate 202 is driven LOW by the reset circuit as soon as the peak detector reset signal passes through flip-flops 190 and 192, thereby disabling the output of the analog comparator circuit 36. Accordingly, once the peak detector reactivated the NAND gate input connected to flip-flop 192 is driven HIGH, enabling the digital output of comparator 150 to pass through the NAND gate and out of the analog-to-digital thresholding circuit 36. This digital signal can then be further processed.

In the preferred embodiment of the present invention, as shown by FIG. 1, the digital output of the dynamic thresholding circuit 22 is compared to a reference memory 24 containing a known good digital representation of the image pattern being inspected. The board on which the inspected image pattern lies may be rejected or accepted based on the result of this comparison.

Accordingly, an optical imaging surface inspection system utilizing dynamic thresholding has been described in its preferred embodiment. However, with the present disclosure in mind, it is understood that the present disclosure of the preferred embodiment is made only by way of example, and that various changes may be implemented without departing from the true spirit and scope of the invention as hereafter claimed.

What is claimed is:

1. An optical imaging surface inspection system for detecting defects in an image pattern on a surface, comprising:
   an illumination source for shining light onto the surface being inspected;
   a video camera for detecting a portion of the light reflected from the surface and for outputting an analog video signal comprising a series of pulses, the amplitude of said pulses in said signal corresponding to the amount of light detected by the video camera;
   a dynamic thresholding circuit for converting said analog video signal into a digital representation of said image pattern, said circuit comprising (i) a black level removal circuit for stripping from said video signal a black level signal component representing light reflected by a background surface area surrounding the image pattern thereby leaving a white level signal component representing light reflected by the image pattern, (ii) a peak detector circuit for detecting the peak amplitude of each of the pulses in said white level signal component and to output a variable peak voltage having an amplitude corresponding to the highest voltage detected for each pulse, (iii) a converter circuit for selecting a percentage of said variable peak voltage to provide a variable threshold voltage level for each pulse, (iv) a delay circuit for delaying said white level signal component of said video signal by an amount of time equalling the time it takes for said white level signal component to pass through said peak detector circuit and said converter circuit, and (v) an analog-to-digital comparator for comparing said variable threshold voltage level provided for each pulse with each pulse in said delayed white level signal component to provide a digital output representation of the image pattern being scanned; and
   circuitry for post-processing the digital representation of said image pattern provided by said dynamic thresholding circuit to identify defects in the image pattern.

2. The system of claim 1, further comprising circuitry for continuously scanning the surface so that the analog video signal representing the image pattern can be continuously processed, digitized, and post-processed.

3. The system of claim 2, further comprising a lens for focusing light reflected by the surface being inspected onto a lens of said video camera.

4. The system of claim 1, wherein said dynamic thresholding circuit further comprises a reset circuit for said peak detector circuit for temporarily disabling said analog-to-digital comparator and for resetting said variable threshold level to a predetermined minimum level intermediate detection of each of said pulses.

5. The system of claim 4, wherein said dynamic thresholding circuit further comprises an automatic gain control circuit for amplifying said white level signal component when the amplitude of said white level signal component falls below a predetermined value.

6. The system of claim 5, wherein said predetermined value is manually selectable.

7. The system of claim 4, wherein said converter circuit comprises a digital-to-analog multiplier operatively connected to said peak detector circuit, said digital-to-analog multiplier having digital input lines for controlling said percentage of said variable peak voltage.

8. The system of claim 4, wherein said predetermined value is manually selectable.

9. A dynamic thresholding circuit for use in an optical imaging surface inspection system for detecting defects in an image pattern on the surface, comprising:
   an input for receiving an analog video signal from a video camera scanning the surface, said video signal comprising a series of pulses, the amplitude of said pulses representing the amount of light reflected by the image pattern and a background surface area surrounding the image pattern;
   a black level removal circuit for stripping from said video signal a black level signal component representing light reflected by said background surface thereby leaving a white level signal component representing light reflected by said image pattern;

a peak detector circuit for detecting the peak amplitude of each of the pulses in said white level signal component and to output a variable peak voltage having an amplitude corresponding to the highest voltage detected for each pulse;

a converter circuit for selecting a percentage of said variable peak voltage to provide a variable threshold voltage level for each pulse;

a delay circuit for delaying said white level signal component of said video signal by an amount of time equalling the time it takes for said white level signal component to pass through said peak detector circuit and said converter circuit; and an analog-to-digital comparator for comparing said variable threshold voltage level provided for each pulse with each pulse in said delayed white level signal component to provide a digital output representation of the image pattern being scanned.

10. The circuit of claim 9, wherein said black level removal circuit comprises a single diode-capacitor network.

11. The circuit of claim 9, further comprising a first video buffer intermediate said input and said black level removal circuit and a second video buffer intermediate said black level removal circuit and said peak detector circuit.

12. The circuit of claim 9, further comprising an automatic gain control circuit for amplifying said white level signal component when the amplitude of said white level signal component falls below a predetermined value.

13. The circuit of claim 12, wherein said predetermined value is manually selectable.

14. The circuit of claim 9, further comprising a reset circuit for said peak detector circuit for temporarily disabling said analog-to-digital comparator and for resetting said variable threshold level to a predetermined minimum level intermediate detection of each of said successive pulses.

15. The circuit of claim 12 wherein said converter circuit comprises a digital-to-analog multiplier operatively connected to said peak detector circuit, said digital-to-analog multiplier having digital input lines for controlling said percentage of said variable peak voltage.

16. The circuit of claim 14, wherein said predetermined value as manually selectable.

17. A method of outputting a digital signal representation of an image pattern on a surface, comprising the steps of:

providing a surface to be inspected;
illuminating the surface;
scanning the surface with a video camera, the output of which is an analog signal comprising a series of pulses each having an amplitude corresponding to the amount of light reflected by the surface and detected by the video camera;
stripping from said video signal a black level signal component representing light reflected by a background surface area surrounding the image pattern thereby leaving a white level signal component representing light reflected by the image pattern;
detecting the peak amplitude of the pulses in the white level signal component with a peak detector;
outputting a variable peak voltage having an amplitude corresponding to the highest voltage detected for each pulse;

selecting a percentage of said variable peak voltage with a converter circuit to provide a variable threshold voltage level for each pulse;
delaying said white level signal component by an amount of time equalling the time it takes for said white level signal component to pass through said peak detector and said converter circuit; and
comparing each pulse in said delayed white level signal component to said variable threshold voltage level provided for that pulse to provide a digital output representation of the image pattern being scanned.

18. The method of claim 17, further comprising the step of post-processing of the image pattern being scanned to identify defects in the pattern.

19. The method of claim 17, wherein said step of detecting the peak amplitude of the pulses in the white level signal component includes the steps of temporarily disabling said analog-to-digital comparator and resetting said peak detector intermediate detection of each of said peaks.

20. The method of claim 18, further comprising the step of providing an automatic gain control circuit for amplifying said white level signal component when the amplitude of said white level signal component falls below a predetermined value.

21. The method of claim 20, wherein said predetermined value is manually selectable.

22. The method of claim 20, wherein said step of selecting a percentage of said variable peak voltage includes the step of providing digital data input to a digital-to-analog multiplier operatively connected to said peak detector for controlling the selection of said percentage.

23. The method of claim 21, further comprising the step of providing a minimum threshold voltage level if the amplitude of said white level signal component is less than a predetermined value.

24. A method of digitizing an analog video signal having (i) a white level signal component representing light detected by a video camera which is reflected by an image pattern on a surface and (ii) a black level signal component representing light detected by the video camera which is reflected by the surface area surrounding the image pattern, said digitizing method comprising the steps of:

stripping from the analog video signal said black level signal component leaving said white level signal component;
detecting the peak amplitude of pulses in the white level signal component using a peak detector circuit;
outputting a variable peak voltage having an amplitude corresponding to the highest voltage detected for each pulse;
selecting a percentage of said variable peak voltage using a converter circuit to provide a variable threshold voltage level for each pulse;
delaying said white level signal component by an amount of time equalling the time it takes for said white level signal component to pass through said peak detector circuit and said converter circuit; and
comparing each pulse in said delayed white level signal component to said variable threshold voltage level provided for that pulse to provide a digital output representation of the image pattern.

25. The method of claim 24, wherein said converter circuit is manually programmable.

26. The method of claim 24, wherein said step of detecting the peak amplitude of pulses in the white level signal component includes the steps of temporarily disabling said analog-to-digital comparator and resetting said peak detector circuit intermediate detection of successive peaks.

27. The method of claim 26, wherein said step of selecting a percentage of said variable peak voltage includes the step of providing digital data input to a digital-to-analog multiplier operatively connected to said peak detector for controlling the selection of said percentage.

28. The method of claim 27, further comprising the step of providing a minimum threshold voltage level if the amplitude of said white level signal component is less than a predetermined value.

29. The method of claim 26, further comprising the step of providing an automatic gain control circuit for amplifying said white level signal component when the amplitude of said white level signal component falls below a predetermined value.

30. The method of claim 29, wherein said predetermined value is manually selectable.

* * * * *